US010008739B2

(12) United States Patent
Liang et al.

(10) Patent No.: US 10,008,739 B2
(45) Date of Patent: Jun. 26, 2018

(54) SOLID-STATE LITHIUM BATTERY WITH ELECTROLYTE

(71) Applicant: Front Edge Technology, Inc., Baldwin Park, CA (US)

(72) Inventors: Jiuh-Ming Liang, Hacienda Heights, CA (US); Kai Wei Nieh, Monrovia, CA (US)

(73) Assignee: FRONT EDGE TECHNOLOGY, INC., Baldwin Park, CA (US)

( * ) Notice: Subject to any disclaimer, the term of this patent is extended or adjusted under 35 U.S.C. 154(b) by 568 days.

(21) Appl. No.: 14/629,277

(22) Filed: Feb. 23, 2015

(65) Prior Publication Data

US 2016/0248117 A1 Aug. 25, 2016

(51) Int. Cl.
| | |
|---|---|
| *H01M 6/12* | (2006.01) |
| *H01M 10/0562* | (2010.01) |
| *H01M 10/052* | (2010.01) |
| *H01M 10/0585* | (2010.01) |
| *C23C 14/34* | (2006.01) |
| *C23C 14/08* | (2006.01) |
| *H01M 4/04* | (2006.01) |

(52) U.S. Cl.
CPC ......... *H01M 10/0562* (2013.01); *C23C 14/08* (2013.01); *C23C 14/34* (2013.01); *C23C 14/3414* (2013.01); *H01M 4/0426* (2013.01); *H01M 10/052* (2013.01); *H01M 10/0585* (2013.01); *H01M 2300/0068* (2013.01)

(58) Field of Classification Search
CPC .......... H01M 10/0562; H01M 10/052; H01M 10/0585; H01M 4/0426; H01M 2300/0068; C23C 14/34; C23C 14/08; C23C 14/3414

USPC ......................................................... 429/162
See application file for complete search history.

(56) References Cited

U.S. PATENT DOCUMENTS

| | | | |
|---|---|---|---|
| 3,375,135 A | 3/1968 | Moulton et al. | |
| 3,393,508 A | 7/1968 | Ray | |
| 3,414,685 A | 12/1968 | Geib et al. | |
| 3,530,007 A | 9/1970 | Golubovic | |
| 3,844,841 A | 10/1974 | Baker | |
| 3,969,142 A | 7/1976 | Greatbatch et al. | |
| 3,993,508 A | 11/1976 | Erlichman | |

(Continued)

FOREIGN PATENT DOCUMENTS

| | | |
|---|---|---|
| CN | 1661354 A | 8/2005 |
| CN | 1665354 | 8/2005 |

(Continued)

OTHER PUBLICATIONS

Antaya et al. "Preparation and Characterization of LiCoO2 Thin Films by Laser Ablation Deposition", J. Electrochem. Soc., vol. 140, No. 3, Mar. 1993, pp. 575-578.

(Continued)

*Primary Examiner* — Gary Harris
(74) *Attorney, Agent, or Firm* — Ashok K. Janah; Janah & Associates, PC (57) ABSTRACT

A solid-state lithium battery cell comprises a support, and a plurality of electrodes on the support, the electrodes comprising a cathode and an anode. An electrolyte lying between the cathode and anode comprises an oxygen-rich electrolyte layer. In another version, a multilayer electrolyte comprises an oxygen-rich electrolyte layer and an oxygen-deficient electrolyte layer.

20 Claims, 6 Drawing Sheets

(56) References Cited

U.S. PATENT DOCUMENTS

| | | |
|---|---|---|
| 4,031,449 A | 6/1977 | Trombly |
| 4,119,769 A | 10/1978 | Schneider et al. |
| 4,204,036 A | 5/1980 | Cohen et al. |
| 4,233,371 A | 11/1980 | Dorrestijn |
| 4,279,726 A | 7/1981 | Baird et al. |
| 4,309,494 A | 1/1982 | Stockel |
| 4,421,835 A | 12/1983 | Manassen et al. |
| 4,459,328 A | 7/1984 | Mizuhara |
| 4,543,441 A | 9/1985 | Kumada et al. |
| 4,565,753 A | 1/1986 | Goebel et al. |
| 4,597,844 A | 7/1986 | Hiraki et al. |
| 4,619,865 A | 10/1986 | Keem et al. |
| 4,663,183 A | 5/1987 | Ovshinsky et al. |
| 4,698,256 A | 10/1987 | Giglia et al. |
| 4,714,660 A | 12/1987 | Gates, Jr. |
| 4,725,345 A | 2/1988 | Sakamoto et al. |
| 4,777,090 A | 10/1988 | Ovshinsky et al. |
| 4,871,433 A | 10/1989 | Wagner et al. |
| 4,873,115 A | 10/1989 | Matsumura et al. |
| 4,877,677 A | 10/1989 | Hirochi et al. |
| 4,882,212 A | 11/1989 | SingDeo et al. |
| 4,904,542 A | 2/1990 | Mroczkowski |
| 4,996,079 A | 2/1991 | Itoh |
| 5,019,467 A | 5/1991 | Fujiwara |
| 5,171,413 A | 12/1992 | Arntz et al. |
| 5,197,889 A | 3/1993 | Rizzo et al. |
| 5,240,794 A | 8/1993 | Thackeray et al. |
| 5,249,554 A | 10/1993 | Tam Or et al. |
| 5,250,891 A | 10/1993 | Glasgow |
| 5,253,300 A | 10/1993 | Knapp |
| 5,254,415 A | 10/1993 | Williams et al. |
| 5,262,028 A | 11/1993 | Manley |
| 5,330,853 A | 7/1994 | Hofmann et al. |
| 5,338,625 A | 8/1994 | Bates et al. |
| 5,368,939 A | 11/1994 | Kawamura et al. |
| 5,445,906 A | 8/1995 | Hobson et al. |
| 5,478,456 A | 12/1995 | Humpal et al. |
| 5,490,911 A | 2/1996 | Makowiecki et al. |
| 5,498,490 A | 3/1996 | Brodd |
| 5,503,912 A | 4/1996 | Setoyama et al. |
| 5,506,858 A | 4/1996 | Takenaka et al. |
| 5,511,587 A | 4/1996 | Miya et al. |
| 5,512,147 A | 4/1996 | Bates et al. |
| 5,512,387 A | 4/1996 | Ovshinsky |
| 5,516,340 A | 5/1996 | Takeuchi et al. |
| 5,547,767 A | 8/1996 | Paidassi et al. |
| 5,552,242 A | 9/1996 | Ovshinsky et al. |
| 5,554,456 A | 9/1996 | Ovshinsky et al. |
| 5,561,004 A | 10/1996 | Bates et al. |
| 5,597,660 A | 1/1997 | Bates et al. |
| 5,607,789 A | 3/1997 | Treger et al. |
| 5,612,152 A | 3/1997 | Bates et al. |
| 5,629,560 A | 5/1997 | Katsui et al. |
| 5,650,243 A | 7/1997 | Ferment et al. |
| 5,656,364 A | 8/1997 | Rickerby et al. |
| 5,663,183 A | 9/1997 | Frost et al. |
| 5,670,252 A | 9/1997 | Makowiecki et al. |
| 5,670,272 A | 9/1997 | Cheu et al. |
| 5,681,666 A | 10/1997 | Treger et al. |
| 5,700,551 A | 12/1997 | Kukino et al. |
| 5,705,293 A | 1/1998 | Hobson |
| 5,705,297 A | 1/1998 | Warren |
| 5,707,715 A | 1/1998 | deRochemont et al. |
| 5,708,297 A | 1/1998 | Clayton |
| 5,725,909 A | 3/1998 | Shaw et al. |
| 5,814,159 A | 6/1998 | Lehan et al. |
| 5,786,582 A | 7/1998 | Roustaei et al. |
| 5,818,199 A | 10/1998 | Beard |
| 5,824,374 A | 10/1998 | Bradley, Jr. et al. |
| 5,871,865 A | 2/1999 | Barker et al. |
| 5,894,656 A | 4/1999 | Menon et al. |
| 5,932,368 A | 8/1999 | Batawi et al. |
| 5,961,672 A | 10/1999 | Skotheim et al. |
| 5,981,102 A | 11/1999 | Grigg et al. |
| 5,985,485 A | 11/1999 | Ovshinsky et al. |
| 6,017,654 A | 1/2000 | Kumta et al. |
| 6,022,640 A | 2/2000 | Takada et al. |
| 6,039,850 A | 3/2000 | Schulz |
| 6,040,680 A | 3/2000 | Toya et al. |
| 6,046,575 A | 4/2000 | Demuro |
| 6,051,114 A | 4/2000 | Yao et al. |
| 6,118,248 A | 9/2000 | Gartstein et al. |
| 6,146,715 A | 11/2000 | Kim et al. |
| 6,148,503 A | 11/2000 | Delnick et al. |
| 6,168,884 B1 | 1/2001 | Neudecker et al. |
| 6,197,450 B1 | 3/2001 | Nathan et al. |
| 6,217,623 B1 | 4/2001 | Reichert et al. |
| 6,218,049 B1 | 4/2001 | Bates et al. |
| 6,220,765 B1 | 4/2001 | Tatoh |
| 6,227,204 B1 | 5/2001 | Baumann et al. |
| 6,238,847 B1 | 5/2001 | Axtell, III et al. |
| 6,242,129 B1 | 6/2001 | Johnson |
| 6,264,709 B1 | 7/2001 | Yoon et al. |
| 6,280,875 B1 | 8/2001 | Kwak et al. |
| 6,287,711 B1 | 9/2001 | Nieh et al. |
| 6,340,880 B1 | 1/2002 | Higashijima et al. |
| 6,365,010 B1 | 4/2002 | Hollars |
| 6,379,835 B1 | 4/2002 | Kucherovsky et al. |
| 6,387,039 B1 | 5/2002 | Moses |
| 6,387,563 B1 | 5/2002 | Bates |
| 6,398,824 B1 | 6/2002 | Johnson |
| 6,402,796 B1 | 6/2002 | Johnson |
| 6,411,780 B1 | 6/2002 | Maruyama |
| 6,413,645 B1 | 7/2002 | Graff et al. |
| 6,413,675 B1 | 7/2002 | Harada |
| 6,461,757 B1 | 10/2002 | Sasayama et al. |
| 6,472,295 B1 | 10/2002 | Morris et al. |
| 6,517,968 B2 | 2/2003 | Johnson |
| 6,558,836 B1 | 5/2003 | Whitacre et al. |
| 6,632,563 B1 | 10/2003 | Krasnov et al. |
| 6,636,017 B2 | 10/2003 | Zink et al. |
| 6,645,658 B2 | 11/2003 | Morozumi |
| 6,658,124 B1 | 12/2003 | Meadows |
| 6,661,197 B2 | 12/2003 | Zink et al. |
| 6,696,199 B2 | 2/2004 | Yoshida et al. |
| 6,700,766 B2 | 3/2004 | Sato |
| 6,713,987 B2 | 3/2004 | Krasnov et al. |
| 6,780,544 B2 | 8/2004 | Noh |
| 6,805,998 B2 | 10/2004 | Jenson et al. |
| 6,863,699 B1 | 3/2005 | Krasnov et al. |
| 6,866,901 B2 | 3/2005 | Burrows et al. |
| 6,916,679 B2 | 7/2005 | Snyder et al. |
| 6,921,464 B2 | 7/2005 | Krasnov et al. |
| 6,940,988 B1 | 9/2005 | Shennib et al. |
| 6,982,132 B1 | 1/2006 | Goldner et al. |
| 7,037,621 B2 | 5/2006 | Kikuchi et al. |
| 7,056,620 B2 | 6/2006 | Krasnov et al. |
| 7,122,908 B2 | 10/2006 | Jiang et al. |
| 7,131,189 B2 | 11/2006 | Jenson |
| 7,157,187 B2 | 1/2007 | Jenson |
| 7,186,479 B2 | 3/2007 | Krasnov et al. |
| 7,194,801 B2 | 3/2007 | Jenson et al. |
| 7,194,901 B2 | 3/2007 | Silverbrook et al. |
| 7,286,479 B2 | 3/2007 | Bragg |
| 7,204,862 B1 | 4/2007 | Zhang |
| 7,276,878 B2 | 10/2007 | Phillips et al. |
| 7,308,316 B2 | 12/2007 | Schommer |
| 7,359,590 B2 | 4/2008 | Hsu |
| 7,397,118 B2 | 7/2008 | Tominaga |
| 7,501,202 B2 | 3/2009 | Enomoto et al. |
| 7,510,582 B2 | 3/2009 | Krasnov et al. |
| 7,524,577 B2 | 4/2009 | Bates |
| 7,701,176 B2 | 4/2010 | Chen |
| 7,776,478 B2 | 8/2010 | Klassen |
| 7,846,579 B2 | 12/2010 | Krasnov et al. |
| 7,862,627 B2 | 1/2011 | Li et al. |
| 7,862,927 B2 | 1/2011 | Krasnov et al. |
| 7,959,769 B2 | 6/2011 | Zhang et al. |
| 7,939,205 B2 | 10/2011 | Klassen |
| 8,030,898 B2 | 10/2011 | Okuto |
| 8,168,322 B2 | 5/2012 | Krasnov et al. |
| 8,502,494 B2 | 8/2013 | Nieh et al. |
| 8,628,645 B2 | 1/2014 | Wang et al. |
| 8,679,674 B2 | 3/2014 | Krasnov et al. |

(56) References Cited

U.S. PATENT DOCUMENTS

| | | |
|---|---|---|
| 8,728,176 B2 | 5/2014 | Li et al. |
| 8,728,287 B2 | 5/2014 | Martin |
| 8,753,724 B2 | 6/2014 | Nieh et al. |
| 8,864,954 B2 | 10/2014 | Liang et al. |
| 8,865,340 B2 | 10/2014 | Liang et al. |
| 8,870,974 B2 | 10/2014 | Nieh et al. |
| 2001/0007335 A1 | 7/2001 | Tuttle et al. |
| 2001/0041294 A1 | 11/2001 | Chu et al. |
| 2001/0052455 A1 | 12/2001 | Hong |
| 2001/0052645 A1 | 12/2001 | Op'T Eynde et al. |
| 2002/0001746 A1 | 1/2002 | Jaenson et al. |
| 2002/0004167 A1 | 1/2002 | Jenson et al. |
| 2002/0028384 A1 | 3/2002 | Krasnov et al. |
| 2002/0041930 A1 | 4/2002 | Erdemir et al. |
| 2002/0071989 A1 | 6/2002 | Verma et al. |
| 2002/0100989 A1 | 8/2002 | Jiang et al. |
| 2002/0102400 A1 | 8/2002 | Gorokhovsky et al. |
| 2002/0110733 A1 | 8/2002 | Johnson |
| 2002/0156823 A1 | 10/2002 | Breitkopf et al. |
| 2003/0121142 A1 | 7/2003 | Kikuchi et al. |
| 2003/0143460 A1 | 7/2003 | Yoshida et al. |
| 2003/0152829 A1 | 8/2003 | Zhang et al. |
| 2003/0160589 A1 | 8/2003 | Krasnov et al. |
| 2004/0018424 A1 | 1/2004 | Zhang et al. |
| 2004/0064937 A1 | 4/2004 | Krasnov et al. |
| 2004/0086762 A1 | 5/2004 | Maeda et al. |
| 2004/0175609 A1 | 9/2004 | Yageta et al. |
| 2004/0178057 A1 | 9/2004 | Leu et al. |
| 2005/0079411 A1 | 4/2005 | Kairawicz et al. |
| 2005/0079418 A1 | 4/2005 | Kelley et al. |
| 2005/0112461 A1 | 5/2005 | Amine et al. |
| 2005/0130032 A1 | 6/2005 | Krasnov et al. |
| 2005/0147877 A1 | 7/2005 | Tarnowski et al. |
| 2005/0156573 A1 | 7/2005 | Lin |
| 2005/0275370 A1 | 12/2005 | Kim |
| 2006/0027937 A1 | 2/2006 | Benson et al. |
| 2006/0040169 A1 | 2/2006 | Liu et al. |
| 2006/0040170 A1 | 2/2006 | Liu et al. |
| 2006/0060956 A1 | 3/2006 | Tanikella |
| 2006/0068258 A1 | 3/2006 | Kinoshita |
| 2006/0115706 A1 | 6/2006 | Maeda et al. |
| 2006/0134522 A1 | 6/2006 | Zhang et al. |
| 2006/0152196 A1 | 7/2006 | Matsumoto et al. |
| 2006/0216589 A1 | 9/2006 | Krasnov et al. |
| 2006/0226812 A1 | 10/2006 | Patino et al. |
| 2006/0267546 A1 | 11/2006 | Shen et al. |
| 2006/0278617 A1 | 12/2006 | Anantharaman et al. |
| 2006/0281002 A1 | 12/2006 | Aoki et al. |
| 2007/0000688 A1 | 1/2007 | Mobley |
| 2007/0037054 A1 | 2/2007 | Kikuchi et al. |
| 2007/0047750 A1 | 3/2007 | Sauer et al. |
| 2007/0047796 A1 | 3/2007 | Anantharaman et al. |
| 2007/0104343 A1 | 5/2007 | Bengtsson et al. |
| 2007/0104344 A1 | 5/2007 | Goldberg |
| 2007/0125638 A1 | 6/2007 | Zhang et al. |
| 2007/0141460 A1 | 6/2007 | You et al. |
| 2007/0166612 A1 | 7/2007 | Krasnov et al. |
| 2007/0172739 A1 | 7/2007 | Visco et al. |
| 2007/0200258 A1 | 8/2007 | Mahler et al. |
| 2007/0297108 A1 | 12/2007 | Collins et al. |
| 2008/0003492 A1 | 1/2008 | Bates |
| 2008/0087986 A1 | 4/2008 | Tanikella |
| 2008/0191342 A1 | 8/2008 | Otremba |
| 2008/0213664 A1 | 9/2008 | Krasnov et al. |
| 2008/0217162 A1 | 9/2008 | Delrue et al. |
| 2008/0253098 A1 | 10/2008 | Liu |
| 2008/0263855 A1 | 10/2008 | Li et al. |
| 2008/0290363 A1 | 11/2008 | Lin et al. |
| 2008/0303056 A1 | 12/2008 | Ward et al. |
| 2008/0308935 A1 | 12/2008 | Kim et al. |
| 2009/0010462 A1 | 1/2009 | Ekchian et al. |
| 2009/0029500 A1 | 1/2009 | Wan |
| 2009/0039498 A1 | 2/2009 | Bayerer |
| 2009/0057136 A1 | 3/2009 | Wang et al. |
| 2009/0114429 A1 | 5/2009 | Sri-Jayantha et al. |
| 2009/0115051 A1 | 5/2009 | Leung et al. |
| 2009/0136839 A1 | 5/2009 | Kraznov et al. |
| 2009/0159433 A1 | 6/2009 | Neudecker et al. |
| 2009/0208671 A1 | 8/2009 | Nieh et al. |
| 2009/0214899 A1 | 8/2009 | Shakespeare et al. |
| 2009/0288943 A1 | 11/2009 | Kwak et al. |
| 2010/0015511 A1 | 1/2010 | Yoo et al. |
| 2010/0028767 A1 | 2/2010 | Inose et al. |
| 2010/0247987 A1 | 9/2010 | Holung et al. |
| 2010/0264017 A1 | 10/2010 | Nam et al. |
| 2010/0285372 A1 | 11/2010 | Lee |
| 2010/0291431 A1 | 11/2010 | Shih et al. |
| 2011/0050159 A1 | 3/2011 | Nieh et al. |
| 2011/0076550 A1 | 3/2011 | Liang et al. |
| 2011/0076567 A1 | 3/2011 | Bouillon |
| 2011/0094094 A1 | 4/2011 | Li et al. |
| 2011/0143227 A1 | 6/2011 | Pulskamp |
| 2011/0270477 A1 | 11/2011 | Falsett et al. |
| 2012/0003520 A1 | 1/2012 | Lee et al. |
| 2012/0034502 A1 | 2/2012 | Nieh et al. |
| 2012/0080940 A1 | 2/2012 | Larsen |
| 2012/0251867 A1 | 10/2012 | Krasnov et al. |
| 2012/0268057 A1 | 10/2012 | Wu |
| 2012/0270114 A1 | 10/2012 | Reynolds et al. |
| 2012/0276305 A1 | 11/2012 | Hamalainen |
| 2013/0098532 A1 | 4/2013 | Liang et al. |
| 2013/0164607 A1 | 6/2013 | Shih |
| 2013/0260230 A1 | 10/2013 | Liang et al. |
| 2014/0087227 A1 | 3/2014 | Shih |
| 2014/0106203 A1 | 4/2014 | Shih |
| 2014/0106216 A1 | 4/2014 | Liang |
| 2014/0166471 A1 | 6/2014 | Wang et al. |
| 2015/0180001 A1* | 6/2015 | Johnson ............... C01G 25/006 429/144 |

FOREIGN PATENT DOCUMENTS

| | | |
|---|---|---|
| EP | 0 829 913 A | 3/1998 |
| EP | 0 933 827 | 8/1999 |
| EP | 1 353 429 A | 10/2003 |
| EP | 1 458 037 A | 9/2004 |
| EP | 1 415 355 | 1/2009 |
| FR | 2 403 652 A | 4/1979 |
| GB | 2251119 A | 6/1992 |
| JP | 59-032023 A | 2/1984 |
| JP | 59-226472 A | 12/1984 |
| JP | 60-072168 | 4/1985 |
| JP | 61195563 A | 8/1986 |
| JP | 04-295015 | 10/1992 |
| JP | 09-259929 A | 10/1997 |
| JP | H09-293516 | 11/1997 |
| JP | 2001-044073 A | 2/2001 |
| JP | 2002-165358 | 6/2002 |
| JP | 2002-313289 | 10/2002 |
| JP | 2003-249199 A | 9/2003 |
| JP | 2009-123516 | 6/2009 |
| JP | 2009-179867 A | 8/2009 |
| KR | 10-1179726 B1 | 9/2012 |
| WO | WO 1995014311 A1 | 5/1995 |
| WO | WO 1998020184 A1 | 5/1998 |
| WO | WO 1999052589 A1 | 10/1999 |
| WO | WO 2001073873 A1 | 10/2001 |
| WO | WO 2002061828 A2 | 8/2002 |
| WO | WO 2004111659 A2 | 12/2004 |
| WO | WO 2006105188 A1 | 10/2006 |
| WO | WO 2008004851 A1 | 1/2008 |
| WO | WO 2008101254 A3 | 8/2008 |
| WO | WO 2009052683 A1 | 4/2009 |

OTHER PUBLICATIONS

Bates et al., "Preferred orientation of polycrystalline LiCoO2 films" J. of the Electrochemical Society (2000), pp. 59-70, Issue No. 147 (1).

Dudney, Nancy, J. "Thin-Film Micro-Batteries", The Electrochemical Society Interface, Fall 2008 pp. 44-48.

(56) References Cited

OTHER PUBLICATIONS

Mattox, Donald M., Handbook of Physical Vapor Deposition (PVD) Processing, Film Formation, Adhesion, Surface Preparation and Contamination Control, 1998, pp. 127-135 and 343-364, Noyes Publications, Westwood, New Jersey, USA.

Roh et al., "Effects of deposition condition on the ionic conductivity . . ." Scripta Materialia, Dec. 17, 1999, pp. 43-49, vol. 42. No. 1, New York, NY.

Wagner et al., "Fabrication and Testing of thermoelectric thin film devices" 15th Int'l Conf. on Thermoelectrics, Mar. 26-29, 1996, pp. 269-273.

\* cited by examiner

SOLID-STATE LITHIUM BATTERY WITH ELECTROLYTE

BACKGROUND

Embodiments of the present invention relate to a solid-state lithium battery having an electrolyte and related fabrication methods.

Lithium batteries are used in applications that require a battery with a high energy density such as, for example, portable electronics, medical devices and space systems. Solid-state, lithium, thin film batteries provide long battery cycle life, low battery capacity fade properties, good operational temperature range, safety and other advantages over conventional battery systems. A typical solid-state lithium battery comprises one or more battery cells, each cell having a set of battery component layers on or between supports. The battery component layers cooperate to store electrical charge and generate a voltage. The battery component layers typically include an electrolyte between electrodes, such as an anode, cathode, anode current collector and cathode current collector. Lithium thin film batteries include those batteries in which the battery component layers are thin solid films which typically have thicknesses of less than about 1000 microns. Such lithium batteries can include one or more battery cells which are stacked together and connected in series or in parallel to provide more power or energy.

However, the electrolyte of the solid-state lithium batteries often has process fabrication issues and operational problems. For example, electrolyte layers of lithium-containing material, such as lithium-phosphorous-oxygen-nitrogen (LiPON), would sometimes delaminate from the underlying layers of the battery cell for unknown reasons. The cause of delamination of the deposited electrolyte layers was difficult to identify as this can result from a number of factors, including the thickness of the electrolyte, the difference in thermal expansion between the electrolyte and underling battery layers, and even the deposition microstructure of the electrolyte. Delamination of the electrolyte reduces production yields and loss of battery capacity over time can result in degraded performance and unexpected failure during battery operation. Battery cells with a LiPON electrolyte layer were also discovered to have low battery energy capacities after as little as 30 charge/discharge cycles.

For these and other reasons, further developments and improvements in the structures, and methods of fabrication of, an electrolyte for a solid-state lithium battery, are continuously being sought.

SUMMARY

A solid-state lithium battery cell comprises a support, and a plurality of electrodes on the support, the electrodes comprising a cathode and an anode. An oxygen-rich electrolyte layer composed of lithium-phosphorous-oxygen-nitrogen is between the cathode and anode, the oxygen-rich electrolyte layer having an atomic concentration of oxygen of at least about 55%.

A solid-state lithium battery cell comprises a support and a plurality of electrodes on the support, the electrodes comprising a cathode and an anode. A multilayer electrolyte composed of lithium-phosphorous-oxygen-nitrogen is between the cathode and anode, the multilayer electrolyte comprising an oxygen-rich electrolyte layer and an oxygen-deficient electrolyte layer, the oxygen-rich electrolyte layer having an atomic concentration of oxygen that is higher than the atomic concentration of oxygen of the oxygen-deficient electrolyte layer.

A method of forming a thin film battery in a process zone having a sputtering target comprising lithium-containing material. The method comprises providing a support in the process zone, the support having a cathode or anode thereon. A multilayer electrolyte is deposited on the anode or cathode by (i) depositing an oxygen-rich electrolyte layer by energizing in the process zone, a first sputtering gas comprising (1) nitrogen at a first partial pressure, and (2) an inert gas; and (ii) depositing an oxygen-deficient electrolyte layer by energizing in the process zone, a second sputtering gas comprising (1) nitrogen at a second partial pressure that is higher than the first partial pressure, and (2) absent the inert gas.

A method of forming a thin film battery in a process zone having a sputtering target comprising lithium-containing material. The method comprises providing a support in the process zone, the support having a cathode or anode thereon. A multilayer electrolyte is deposited by (i) depositing an oxygen-rich electrolyte layer by energizing a first sputtering gas in the process zone, the first sputtering gas consisting essentially of nitrogen and an inert gas; and (ii) before or after (i), depositing an oxygen-deficient electrolyte layer by energizing a second sputtering gas in the process zone, the second sputtering gas consisting essentially of nitrogen.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIG. 4 is a graph of the loss in battery discharge capacity versus cycle number (both charging and discharging cycles) for battery cells having (1) an oxygen-deficient electrolyte layer deposited with only nitrogen (9 mT of $N_2$), (2) an oxygen-rich electrolyte layer deposited with a mixture of nitrogen and argon (3 mTorr of $N_2$+3 mTorr of Ar), (3) an oxygen-rich electrolyte layer deposited with another mixture of nitrogen and argon (6 mTorr of $N_2$+3 mTorr of Ar), (4) an oxygen-rich electrolyte layer deposited with yet another mixture of nitrogen and argon (7.5 mTorr of $N_2$+1.5 mTorr of Ar), and (5) a multilayer electrolyte having an oxygen-deficient electrolyte layer deposited with 6 mTorr of Ar and 3 mTorr of $N_2$ for 13 hrs and an oxygen-rich electrolyte layer deposited with 9 mTorr of $N_2$ at 700 W plasma power for 2 hrs.

DESCRIPTION

Figure 1A:
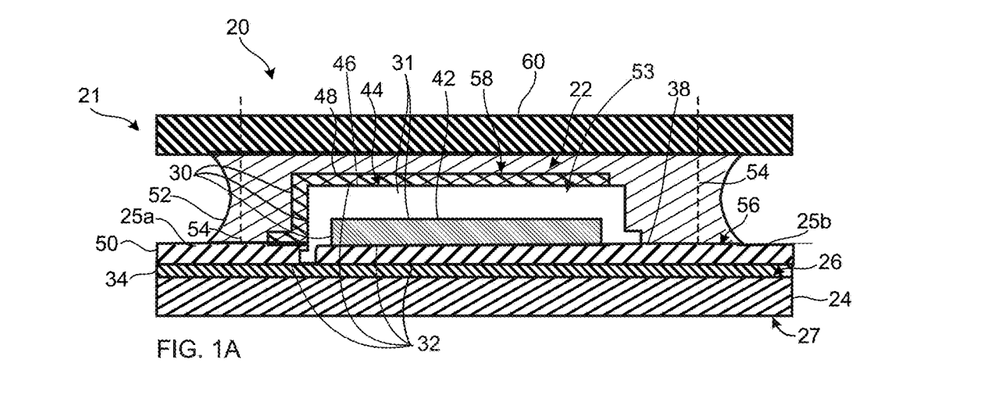
FIG. 1A is a sectional side view of an embodiment of a solid-state lithium battery comprising a single battery cell with an oxygen-rich electrolyte layer sandwiched between electrodes.
Figure 1B:
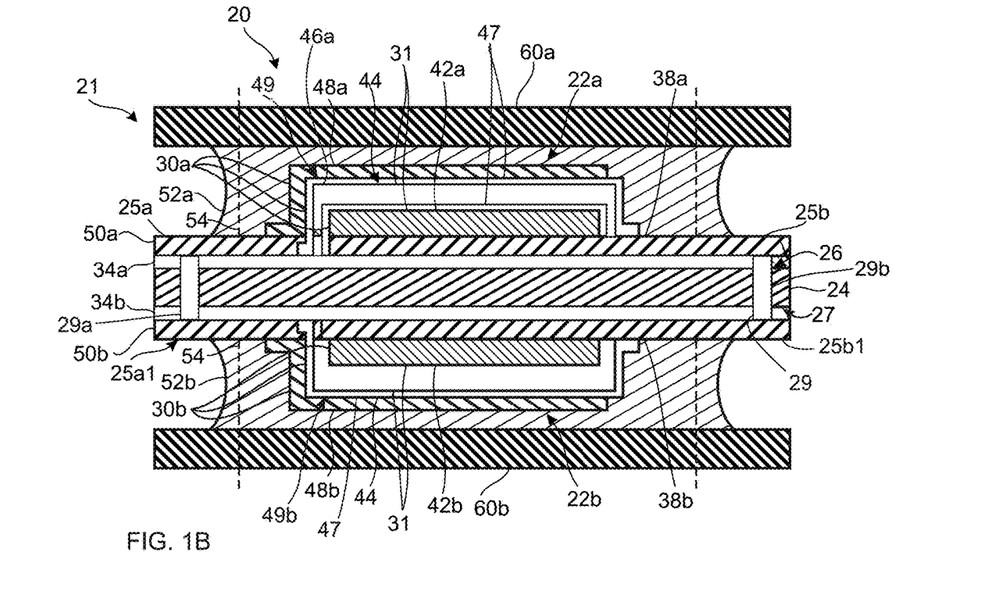
FIG. 1B is a sectional side view of another embodiment of a solid-state lithium battery comprising first and second battery cells formed on a single support, each battery cell having a multilayer electrolyte comprising either a single or two oxygen-rich electrolyte layers abutting an oxygen-deficient electrolyte layer.

Exemplary embodiments of a rechargeable battery 20, as shown in FIGS. 1A and 1B, comprise a protective casing 21 enclosing one or more battery cells 22 or 22a,b on a support 24, and has terminals 25a,b which extend out of the protective casing 21 to connect the battery 20 to an external load or circuit. The exemplary batteries 20 provided herein illustrate the present invention; however, these exemplary battery structures should not be used to limit the scope of the claims, and alternative battery structures that would be apparent to those of ordinary skill in the art are within the scope of the present claims.

Referring to FIG. 1A, the support 24 comprises a material that has low permeability to oxygen, water vapor, carbon monoxide, carbon dioxide and other environmental gases and vapors. The support 24 should also have a relatively smooth surface and sufficient strength to support battery cells 22 at conventional fabrication or operational temperatures. For example, the support 24 can comprise aluminum, aluminum oxide, metal foil, metalized plastic film, mica, quartz, or steel. In one version, the support 24 comprises a first surface 26 and a second surface 27 both of which are planar, or even flat and smooth. One desirable type of support 24 comprises a crystalline sheet formed by cleaving the planes of a cleavable crystalline structure, such as mica or a graphite sheet. The battery cell 22 includes battery component layers 30 that cooperate to form a battery capable of receiving, storing, and discharging electrical energy. The battery component layers 30 can include an optional adhesion layer 34 and a plurality of electrodes 32 such as for example, a cathode current collector 38, cathode 42, anode 48, and anode current collector 50. In this version, an oxygen-rich electrolyte layer 44 is positioned between a pair of the electrodes 32 that include (i) a cathode current collector 38 and/or cathode 42, and (ii) an anode 48 and/or anode current collector 50 for each of the battery cells 22. In a thin film lithium battery, the battery component layers 30 include one or more lithium-containing layers 31 composed of elemental lithium and lithium compounds, and which have thicknesses of from about 0.1 microns to about 1000 microns. The protective casing 21 protects the battery component layers 30, and especially the lithium containing layers 31, from degradation by oxygen and water vapor permeating into the battery cell 22 from the external environment. The protective casing 21 can include a polymer 52 covering one or more of the side perimeter surfaces 54 that extend along the perimeter 56 of the battery 20, as well as the top surface 58 of the battery 20. The casing 21 can also include a cover 60 which covers the otherwise exposed top surface 58 of the battery 20.

While a battery 20 having a single battery cell 22 is shown in FIG. 1A, it should be understood that the battery 20 can have a plurality of battery cells. For example, a version of a battery 20 comprising first and second battery cells 22a,b is shown in FIG. 1B. The first battery cell 22a is formed on an adhesion layer 34a on a first surface 26 of the support 24 and the second battery cell 22b is formed on an adhesion layer 34b on a second surface 27 of the support 24. The battery cells 22a,b can be connected by the connectors 29a,b which can extend through the support 24 (as shown) or around its perimeter (not shown) to connect to the terminals 25a,b and 25a1,b1. Further, while single battery cells 22a,b are illustrated, it should be understood that a plurality of battery cells 22 can be positioned on the top or second surfaces 26, 27, adjacent to or abutting one another. The battery cells 22a,b and any other additional cells can be connected in series or parallel by the connectors 29a,b or other connectors. Each battery cell 22a,b comprises a plurality of battery component layers 30a,b that include an adhesion layer 34a,b; cathode current collector 38a,b; cathode 42a,b; multilayer electrolyte 49a,b (as described further herein), anode 48a,b; and anode current collector 50a,b, respectively. At least some of the battery component layers 30a,b are lithium-containing layers 31a,b. The multicell battery 20 having two opposing battery cells 22a,b can be formed using the same processes used to form a battery 20 with a single cell 22, by flipping over the support 24 to form the battery component layers 30b of the second battery cell 22b, during or after processing of the battery component layers 30a of the first battery cell 22a. Alternatively, the battery component layers 30b of the second battery cell 22b can be formed simultaneously with the battery component layers 30a of cell 22a, using a sputtering chamber having multiple sputtering targets on either side of the battery support 24. In the multicell battery 20, the protective casing 21 includes two polymers 52a,b covering the sides and top of the two battery cells 22a,b, respectively, as well as two covers 60a,b.

An exemplary process of fabricating one or more battery cells 22 of a battery 20 on a top surface 26 and/or bottom surface 27 of a support 24 is illustrated with reference to the flowchart of FIG. 2A. The exemplary fabrication processes is described for a single battery cell 22; however, the same fabrication processes can be used to form more than one battery cell 22a,b on either, or both, of the top and bottom surfaces 26,27 of the support 24. While exemplary embodiments of battery structures and fabrication processes for forming a battery cell 22 or battery cells 22a,b of a battery 20 are described, it should be understood that other structures and fabrication processes as would be apparent to one of ordinary skill in the art are within the scope of the present claims. For example, battery structures and fabrication process included herein are those described in the commonly assigned U.S. patents and publications: U.S. Pat. No. 6,632,563 to Victor Krasnov et al.; U.S. Pat. No. 6,863,699 to Victor Krasnov et al.; U.S. Pat. No. 7,056,620 to Victor Krasnov et al.; U.S. Pat. No. 6,713,987 to Victor Krasnov et al., U.S. Pat. No. 7,846,579 to Victor Krasnov et al.; U.S. Pat. No. 8,679,674 to Victor Krasnov et al.; U.S. Pat. No. 7,862,927 to Victor Krasnov et al.; U.S. Pat. No. 7,862,627 to Jianchao Li et al.; US patent Publication No. 2009-0010462-A1 to Leon Ekchian et al.; pending U.S. patent application Ser. No. 13/198,705 to Kai-wei Nieh et al.; U.S. Pat. No. 8,628,645 to Weng-chung Wang et al.; US patent publication no. 2009-0136839 A1 to Victor Krasnov; U.S. Pat. No. 8,870,974 to Kai-wei Nieh et al.; pending U.S. patent application Ser. No. 12/454,255 255 to Tung-hsiu Shih et al.; U.S. Pat. No. 8,502,494 to Kai-wei Nieh et al.;

U.S. Pat. No. 8,865,340 to Jiuh-ming Liang et al.; pending U.S. patent application Ser. No. 13/434,775 to Jiuh-Ming Liang; Pending U.S. patent application Ser. No. 13/830,550 to Jiuh-Ming Liang; pending U.S. patent application Ser. No. 13/333,969 to Tung-hsiu Shih; U.S. Pat. No. 8,864,954 to Jiuh-Ming Liang et al.; U.S. Pat. No. 8,753,724 to Kai-wei Nieh et al.; pending U.S. patent application Ser. No. 13/652,416 to Tung-hsiu Shih; and pending U.S. patent application Ser. No. 13/626,842 to Tung-hsiu Shih; all of which are incorporated by reference herein and in their entireties.

In the fabrication process, a support 24 is selected, and the top and bottom surfaces 26, 27 of the support 24 are cleaned to remove surface contaminants to obtain good adherence of subsequently deposited layers. For example, the support 24 can be cleaned by an annealing process in which the support 24 is heated to temperatures sufficiently high to clean the surface by burning-off contaminants and impurities, such as organic materials, water, dust, and other materials deposited on the surfaces 26, 27. The support 24 can also be heated to temperatures sufficiently high to remove water of crystallization present in the support material. The annealing temperatures and/or water of crystallization removal temperatures can be, for example, from about 150 to about 600° C., or even at least about 540° C. The annealing process can be conducted in an oxygen-containing gas, such as oxygen or air, or other gas environments, for about 10 to about 120 minutes, for example, about 60 minutes.

After a suitably clean surface is obtained, the battery component layers 30 of one or more battery cells 22 are deposited on one or more supports 24 using a number of different processes. It should also be noted while a single battery cell 22 is being described, the same processes can be used to form a plurality of battery cells 22a,b. During or after fabrication of any of the battery component layers 30 of a battery cell 22, the battery component layers 30 can also be shaped to form shaped features by removing portions of the battery component layers 30 or support 24. The shaping processes can be performed, for example, after deposition of a cathode 42 and oxygen-rich electrolyte layer 44 to shape one or both of these films, such as by etching away the edge portions or forming holes for the terminals 25a,b. Suitable shaping processes include pulsed laser, etching, another such processes, and these processes can be used to form the shapes of the battery component layers 30 shown in FIGS. 1A and 1B, or other shapes that would be apparent to those of ordinary skill in the art.

Optionally, an adhesion layer 34 is deposited on the top surface 26 (or both the top and bottom surfaces 26, 27 for a multicell battery 20) of the support 24 when needed to improve adhesion of overlying battery component layers 30. When used, the adhesion layer 34 can comprise a metal or metal compound, such as for example, aluminum, cobalt, titanium, other metals, or their alloys or compounds thereof; or a ceramic oxide such as, for example, lithium cobalt oxide. When the adhesion layer 34 is fabricated from titanium, the titanium layer is deposited in a sputtering chamber 100 of a sputtering apparatus 90, such as the apparatus shown in FIG. 5. The sputtering process conditions can be, for example, argon flow at a pressure of 2 mTorr; DC (direct current) sputtering plasma set at a power level of 1 kW, deposition time of 30 seconds, and using a sputtering target composed of titanium set at a distance of 10 cm from a support 24.

In the following exemplary embodiment of a fabrication process, a cathode current collector 38, cathode 42 and anode current collector 50 are deposited on the support 24 to form the bottom of a stack of battery component layers 30, prior to depositing an oxygen-rich electrolyte layer 44 thereon. However, it should be understood that an anode current collector 50 and/or anode 48 can also, or instead, be deposited on the support 24 to form the bottom of the stack of battery component layers 30, and thereafter, the oxygen-rich electrolyte layer 44 is deposited over these additional layers.

Figure 2A:
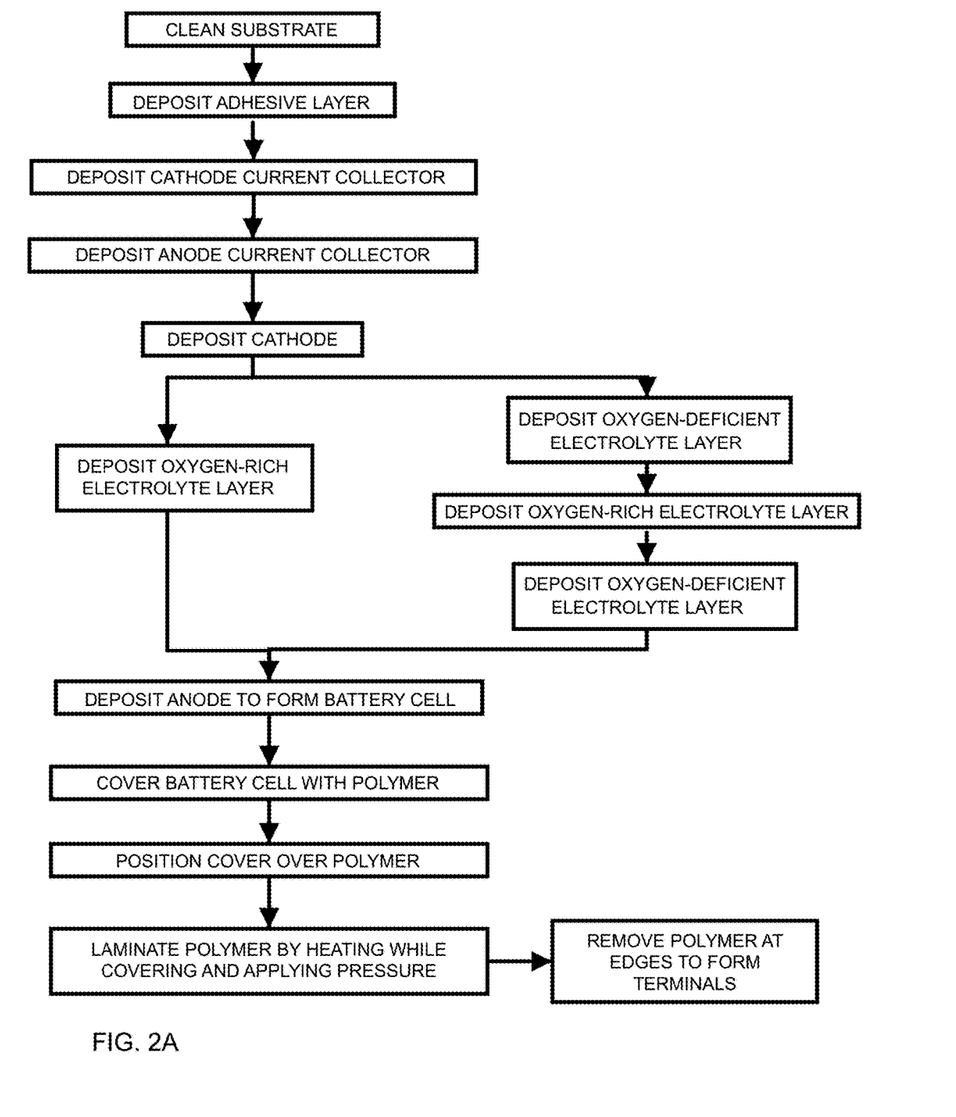
FIG. 2A is a flowchart of an exemplary process for fabricating a battery cell having either an oxygen-rich electrolyte layer or a multilayer electrolyte.

Referring to FIGS. 1A and 2A, a cathode current collector 38 is formed directly on the top surface 26 of the support 24 or on the adhesion layer 34. The cathode current collector 38 is provided to collect the electrons during charge and discharge process. A suitable thickness for the current collector 38 is from about 0.05 microns to about 2 microns. In one version, the current collector 38 comprises platinum in a thickness of about 0.2 microns. The current collector 38 can be formed by deposition of platinum by DC magnetron sputtering in a sputtering chamber 100. For example, the sputtering conditions for depositing a cathode current collector 38 from a platinum target uses sputtering gas comprising argon at a gas pressure of from about 1 mTorr to about 25 mTorr, or even 5 mTorr, in a DC plasma at a power level of from about 10 W to about 100 W, or even 40 W, for from 1 min to about 20 min or even 10 min. A cathode contact pad (not shown) can also optionally be formed to overlay or underlie the cathode current collector 38 and to connect to the terminal 25a.

In the exemplary version shown, an anode current collector 50 (which is also known as an anode contact pad) is also deposited on the adhesion layer 34 such that an outside extending portion of the anode current collector 50 serves as a terminal 25b of the battery cell 22. The anode current collector 50 can be made of the same material as the cathode current collector 38 to provide a conducting surface from which electrons may be dissipated or collected from a subsequently deposited anode 48. For example, the anode current collector 50 can be composed of platinum. The anode current collector 50 typically has a thickness of from about 0.05 microns to about 5 microns. In one version, the anode current collector 50 comprises platinum and is deposited in the same deposition process as the cathode current collector 38, but to cover another portion of the adhesion layer 34 which is separated by a small gap from the portion of the adhesion layer 34 that lies below the cathode current collector 38.

Still further, the anode current collector 50 can also comprise more than one layer, for example, a layer of copper deposited over a layer of platinum. This version is useful when the anode 48 (which touches and electrically contacts the anode current collector 50) is composed of a material such as lithium which would otherwise react with platinum. The copper layer is deposited over a small portion of the platinum layer to prevent undesirable reactions between the lithium anode and the platinum anode contact pad. A suitable sputtering process for sputtering copper comprises DC magnetron sputtering in the sputtering chamber 100 from a copper target using a sputtering gas comprising argon, at a gas pressure of from about 1 mTorr to about 100 mTorr, in a DC plasma at a power level of from about 50 to about 5000 W, and for a time of from about 5 to about 20 minutes, to deposit a copper layer having a thickness of from about 0.1 to 5 microns, or even about 0.2 microns.

A cathode 42 is then deposited on at least a portion of the cathode current collector 38. In one version, the cathode 42 is composed of lithium metal oxide, such as for example, lithium cobalt oxide, lithium nickel oxide, lithium manganese oxide, lithium iron oxide, or even lithium oxides comprising a mixture of transition metals such as for example, lithium cobalt nickel oxide lithium-containing transition metal oxides such as $LiCoO_2$, $LiNiO_2$, $LiMn_2O_4$, $LiMnO_2$, $LiCo_{0.5}Ni_{0.5}O_2$ and $LiNiO_{0.7}Co_{0.2}Mn_{0.1}O_2$ and lithium-free metal oxides such as $MnO_2$. Other types of cathodes 42 that may be used comprise amorphous vanadium pentoxide, crystalline $V_2O_5$ or $TiS_2$. For example, a cathode 42 comprising $LiCoO_2$, which is sputtered in a sputtering chamber 100 supplied with a sputtering gas comprising argon and oxygen in a flow rate of from about 100 sccm to about 500 sccm, a gas pressure of from about 5 mTorr to about 15 mTorr, and a plasma formed by applying a power level of from about 2 KW to about 5 KW to the magnetron 78. A thick or thin cathode 42 can be deposited by varying the deposition time of the cathode deposition process. For example, a thick cathode 42 having a thickness of at least about 10 microns can be deposited using the above-described sputtering conditions in a sputtering process conducted for at least about 300 minutes. Conversely, a thin cathode 42 having a thickness of less than about 5 microns can be deposited using the above-described sputtering conditions in a sputtering process conducted for less about 60 minutes. After deposition of the cathode 42, an annealing step can be performed at temperatures of from about 300° C. to about 600° C. The annealing process can be conducted directly in the sputtering chamber 100 or in a separate annealing chamber.

In the next step, (i) an oxygen-rich electrolyte layer 44 by itself, or (ii) a multilayer electrolyte 49a,b comprising an oxygen-rich electrolyte layer 44 and one or more oxygen-deficient electrolyte layers 49, is deposited on the support 24 such as directly on one of the battery component layers 30 of the battery cell 22. Typically, oxygen-rich electrolyte layer 44 or multilayer electrolyte 49a,b is deposited on at least a portion of the cathode 42, but these electrolyte layers can also be deposited on the anode 48 or other battery component layers 30 depending on the selected structure and deposition sequence of the battery cell 22. Deposition of the electrolyte and its advantages is described in more detail below.

After deposition of the oxygen-rich electrolyte layer 44 or multilayer electrolyte 49a,b, an anode 48 is deposited over the electrolyte material and partially overlapping the anode current collector 50 such that most of the area of the electrolyte material lies sandwiched between the cathode 42 and the anode 48 or anode current collector 50, to receive electrons released by lithium ions that migrate through the electrolyte. The anode 48 can be a lithium-containing material which can be elemental lithium or a lithium compound, or a conducting metal such as copper. In one version, anode 48 is made from elemental lithium. The elemental lithium is also sufficiently conductive to serve as the anode current collector 50, so the anode 48 and anode current collector 50 can also both be made of elemental lithium. The anode 48 can also be composed of the same material as the cathode 42, as previously described. A suitable thickness of the anode 48 is from about 0.1 microns to about 20 microns. The anode 48 can also be permeable as for example described in U.S. Pat. No. 6,713,987, entitled "Rechargeable battery having permeable anode current collector", filed on Feb. 28, 2002, which is incorporated herein by reference in its entirety. The anode 48 can extend to cover the entire area of the cathode 42 or terminate short of the cathode area to provide reduced electrical shorting at the anode edges. A portion of the anode current collector extends beyond the anode 48 to serve as the terminal 25b of the battery cell 22.

After fabrication of one or more battery cells 22 or 22a,b on a support 24, a casing 21 is fabricated to protect the battery cells 22 from degradation in the external environment. In one version, the casing 21 comprises a polymer 52, which can be the same polymer as the polymer described above or a different polymer, and generally comprises a conformal material which can fill out the gaps and uneven heights of the profile of the battery cells 22 to provide a flatter profile. The polymer 52 is applied in liquid or film form, to cover a top surface 58 and/or the side perimeter surfaces 54 of the battery cells 22 and even extending to cover the perimeter 56 of the battery 20.

Thereafter, a cap 60 which forms another portion of the casing 21, is positioned on top of, or spaced apart from, the polymer 52 to cover the battery cell 22, and laminated to the battery cell 22 as shown in FIG. 1A, or two caps 60a,b are laminated to each of the battery cells 22a and 22b, respectively, as shown in FIG. 1B. In one version, the cap 60 is a rigid plate of a ceramic material, a metal foil, or a metal coated plastic film, or a plurality of ceramic and polymer films which are conformal to the shape of the battery. Suitable ceramic materials include aluminum oxide or diamond-like carbon (DLC), and a suitable composition of polymer comprises polymer, epoxy, or even a thermoset or thermoplastic polymer. The cap 60 can also be made from the same material as the support 24. The cap 60 can have a thickness of less than about 50 microns, for example, from about 7 to about 40 microns. After placement, a pressure can be applied to press the cap 60 and the support 24 together to squeeze the polymer 52 therebetween. A suitable pressure may be 3 psi, or even from about 3 to about 60 psi, for example, about 10 psi. The laminating process can be conducted in air or in a non-reactive gas environment, such as argon or nitrogen. A vacuum can also be pulled on the partially fabricated battery 20 using a vacuum pump to remove trapped air and form a better laminate of the cap 60, polymer 52 and underlying support 24. A suitable vacuum comprises a pressure of from about 10 mTorr to about 10 Torr. While the pressure is being applied, the battery cell 22 can also be heated to cure or to soften the polymer 52, a suitable curing or softening temperature being at least about 40° C., or even from about 50 to about 110° C. After curing of polymer 52, the edge portions of the polymer 52 overlying the sections of the cathode current collector 38 and anode current collector 50 that extend beyond the peripheral edge of the battery 20 (see FIGS. 1A and 1B) are peeled off to expose underlying material that serves as the first and second terminals 25a,b, respectively.

One or more of the fabricated battery cells 22 or batteries 20 can be cut out of a support 24 on which a plurality of batteries 20, or battery cells 22, are fabricated. A suitable battery cutting process can include laser or mechanical cutting. Laser cutting can be performed using a pulsed laser process. In one exemplary embodiment, the laser source is a femtosecond laser comprising a diode-pumped solid-state laser with a lasing medium comprising a rod of titanium doped sapphire. In another exemplary embodiment, the pulsed laser source is be an ultraviolet laser such as an excimer or 'excited dimer' laser, which is a chemical laser that uses a combination of an inert gas, such as argon, krypton, or xenon; and a reactive gas such as fluorine or chlorine, to generate a laser beam. Other laser sources can also be used, as would be apparent to one of ordinary skill. Several exemplary laser source and cutting methods are described in commonly assigned U.S. Pat. Nos. 7,862,627 and 8,728,176, both to Jianchao Li et al. and U.S. Pat. No.

8,870,974 to Kai-wei Nieh et al., all of which are incorporated by reference herein and in their entireties.

The properties and sputtering process used to deposit an oxygen-rich electrolyte layer 44 or multilayer electrolyte 49 on the support 24 will now be described referring to FIGS. 1A, 1B, 2A and 2B. The oxygen-rich electrolyte layer 44 and oxygen-deficient electrolyte layer 47 both comprise a lithium-containing material such as amorphous lithium-phosphorus-oxygen-nitrogen (LiPON). The stoichiometry of the LIPON varies through the thickness of the electrolyte; however, the average stoichiometry through the thickness of the layer was determined to be $Li_xPO_yN_z$ with an x:y:z ratio of about 2.9:3.3:0.46. The oxygen-rich electrolyte layer 44 comprises an atomic concentration of oxygen that is higher than the atomic concentration of oxygen of an oxygen-deficient electrolyte layer 47. In one version, the oxygen-rich electrolyte layer 44 comprises an atomic concentration of oxygen that is at least 3% higher than the atomic concentration of oxygen of the oxygen-deficient layer 47. In one version, the oxygen-rich electrolyte layer 44 comprises LiPON having an atomic concentration of oxygen that is at least about 55%; whereas, the oxygen-deficient electrolyte layer comprises LiPON having an atomic concentration of oxygen that is less than about 48%. The atomic concentrations of lithium, phosphorus and oxygen, within a deposited electrolyte layer, were measured using conventional methods such as SIMS (Secondary Ion Mass Spectrometer) and RBS (Rutherford Backscattering Spectroscopy). The oxygen-rich electrolyte layer 44 was also measured to have a slightly higher bulk density of at least about $6.3 \times 10^{22}$ atom/cc, or even equal to or at least about $6.36 \times 10^{22}$ atom/cc.

The multilayer electrolyte 49a,b comprises an oxygen-rich electrolyte layer 44 abutting at least one oxygen-deficient electrolyte layer 47 to form an interface therebetween, as shown in FIG. 1B. In one version, the multilayer electrolyte 49a comprises an oxygen-rich electrolyte layer 44 sandwiched between two layers of oxygen-deficient electrolyte layer 47, as shown for battery cell 22a of FIG. 1B. In another version, the multilayer electrolyte 49b comprises a single layer of oxygen-deficient electrolyte layer 47 deposited on either side, that is above or below, and directly on, the oxygen-rich electrolyte layer 44, as shown in battery cell 22b of FIG. 1B. The oxygen-deficient electrolyte layer 47 was measured to have a bulk density of less than about $6.2 \times 10^{22}$ atom/cc or even equal to or less than about $6.12 \times 10^{22}$ atom/cc, which is substantially lower than the bulk density of the oxygen-rich electrolyte layer 44.

The sputtering process conditions for depositing either an oxygen-rich electrolyte layer 44 or an oxygen-deficient electrolyte layer 47 use sputtering gases having different nitrogen partial pressures. In a mixture of gases, each gas has a partial pressure which is the hypothetical pressure of that gas if it alone occupied the volume of the mixture at the same temperature. The oxygen-rich electrolyte layer 44 is deposited with a first sputtering gas comprising nitrogen at a first partial pressure, while the oxygen-deficient electrolyte layer 47 is deposited with a second sputtering gas comprising nitrogen at a second partial pressure, the second partial pressure being higher than the first partial pressure. In one version, the first partial pressure of nitrogen used to deposit the oxygen-rich electrolyte layer 44 is less than about 3 mTorr, or even from about 1.5 mTorr to about 3 mTorr; and the second partial pressure of nitrogen used to deposit the oxygen-deficient electrolyte layer 47 is at least about 6 mTorr, or even at least about 9 mTorr. The mixture of nitrogen and argon used to deposit the oxygen-rich electrolyte layer 44 generates a lower partial pressure of nitrogen due to the presence of argon in the gas mixture, while the pure nitrogen used to deposit the oxygen-deficient electrolyte layer 47 generates a higher nitrogen partial pressure.

Figure 5:
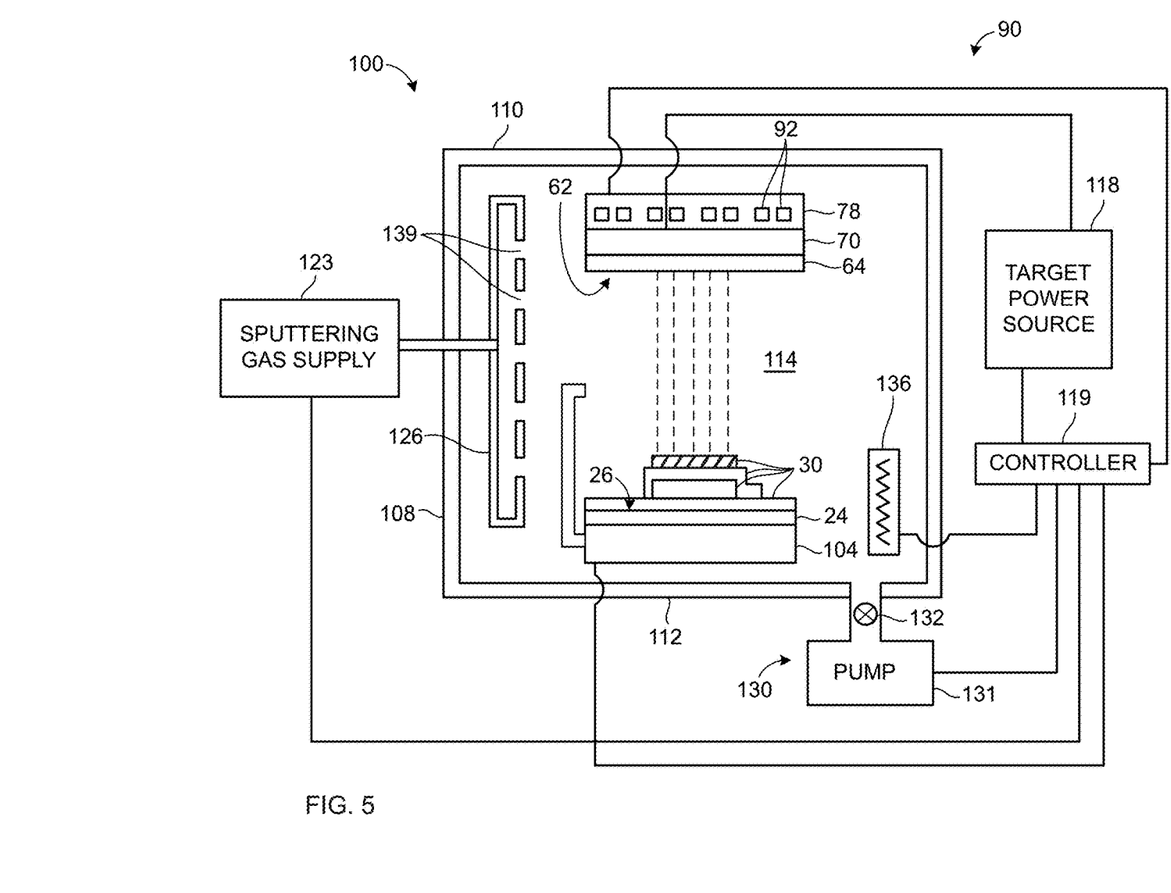
FIG. 5 is a sectional side schematic view of a sputtering chamber capable of depositing the battery component layers of a battery cell.

In one version, the oxygen-rich electrolyte layer 44 is deposited using a sputtering target composed of $Li_3PO_4$ which is sputtered using a sputtering gas comprising, or even consisting essentially of (i) nitrogen and (ii) an inert gas such as argon. In one version, the sputtering gas consists essentially of, or even consists of, nitrogen and argon. By consisting essentially of it is meant that other gases comprise less than 5% or even less than 2% by volume of sputtering gas composition. The selected mixture of gases was found to deposit an oxygen-rich LiPON electrolyte layer. In one version, the sputtering gas comprises nitrogen at a flow rate of at least about 60 sccm, or from about 80 to about 120 sccm; and argon at a flow rate of at least about 60 sccm, or even from about 120 to about 240 sccm. The sputtering gas is introduced into a sputtering chamber 100 of a sputtering apparatus 90, as illustrated in FIG. 5, and maintained in the chamber 100 at a pressure of from about 7 to about 15 mTorr using the throttle valve 132. In this version, the flow rate of the nitrogen gas is set using mass or volumetric flow meters, such as for example, a MKS 1160B model mass flow control meter, available from MKS Instruments, Andover, Mass. The sputtering gas of nitrogen and argon can be energized by applying to a magnetron 78 supporting the sputtering target 62, a current at a power level of from about 500 to about 1500 watts. Typically, the sputtering processes is conducted for from about 5 to about 20 hours to deposit an oxygen-rich electrolyte layer 44 having a thickness of from about 0.5 to about 4 micrometers.

Figure 2B:
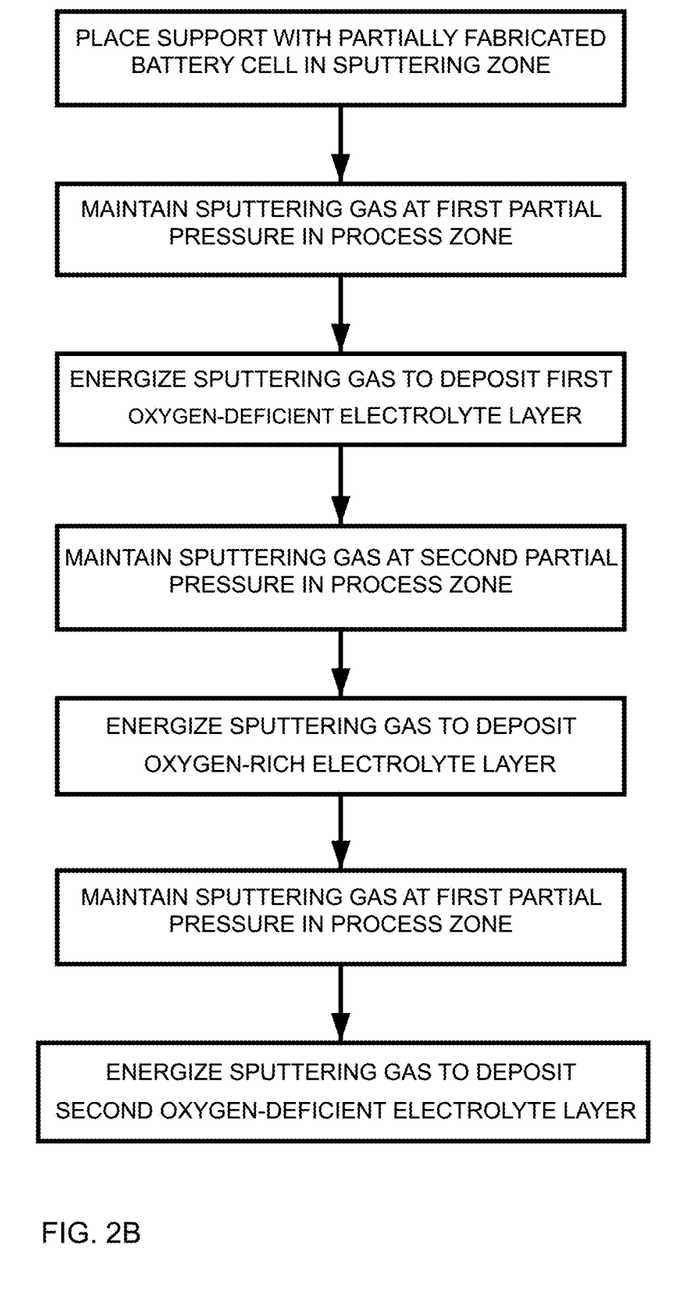
FIG. 2B is a flowchart of an exemplary process for fabricating a multilayer electrolyte having an oxygen-rich electrolyte layer sandwiched between two oxygen-deficient electrolyte layers.

The multilayer electrolyte 49a,b comprising an oxygen-rich electrolyte layer 44 abutting at least one oxygen-deficient electrolyte layer 47, is deposited in a multiple step sputtering process, as illustrated in FIGS. 2A (right branch) and 2B. In this structure, the oxygen-deficient electrolyte layer 47 can be deposited before or after deposition of the oxygen-rich electrolyte layer 44, to form an interface above or below the oxygen-rich electrolyte layer 44. To deposit the oxygen-deficient electrolyte layer 47, a sputtering target composed of $Li_3PO_4$ is sputtered using a sputtering gas comprising, or even consisting essentially of, or even consisting of, nitrogen at the selected partial pressure of nitrogen. By consisting essentially of it is meant that other gases comprise less than 5% or even less than 2% by volume of sputtering gas composition. In one version, the sputtering gas of nitrogen is provided at a volumetric flow rate of at least about 60 sccm, or even from 60 sccm to about 240 sccm, and maintained in the chamber 100 (FIG. 5) at a pressure of from about 6 mTorr to about 9 mTorr. The flow rate of the nitrogen gas is set using a mass or volumetric flow meter and the pressure of the nitrogen is set using the throttle valve 132 of the exhaust 130 of the chamber 100. The sputtering gas is energized by applying to a magnetron 78 supporting the sputtering target 62, a current having a power level of from about 500 to about 1500 watts. Typically, this sputtering process step is conducted for from about 30 to about 240 minutes to deposit an oxygen-deficient electrolyte layer 47 having a thickness of from about 0.1 to about 0.4 micrometer. Typically, the oxygen-rich electrolyte layer 44 is deposited to have a first thickness and the oxygen-deficient electrolyte layer 47 is deposited in a second thickness, such that the first thickness is at least about 5 times the second thickness, or even at least about 10 times the second thickness.

It was determined that the oxygen-rich electrolyte layer 44 and oxygen-deficient electrolyte layer 47 have different compressive stress levels and defect levels that relate to the oxygen content of the two layers. For example, an oxygen-rich electrolyte layer 44 of lithium-phosphorus-oxygen-nitrogen deposited with a mixture of argon and nitrogen was found to have a lower compressive stress level and fewer defects than an oxygen-deficient electrolyte layer 47 deposited with only nitrogen. The lower compressive stresses of the oxygen-rich electrolyte layer 44 resulted in higher battery yields because stressed films tend to delaminate from the underlying battery component layers 30 or the support 24. The stress level of a deposited electrolyte layer is a measure of the internal forces acting within the layer, for example, the average internal force per unit area of a surface within the layer. Compressive stress has a negative value and causes an elastic body to deform or shorten in the direction of the applied load. The compressive stress levels of the oxygen-rich electrolyte layer 44 and oxygen-deficient electrolyte layer 47 were measured by several different techniques, which included destructive and non-destructive techniques. Mechanical dissection methods use the release of stress and its associated strain after cutting a hole or crack in a deposited electrolyte layer. X-ray diffraction and neutron diffraction also allow non-destructive measurement of the residual stress in isolated spots within an electrolyte layer which are spaced apart by distances as small as 100 microns. A suitable visual method of measuring the compressive stress level of different electrolyte layers is simply depositing the electrolyte layers on a thin sheet of mica, for example, a mica sheet having a thickness of less than 50 microns, and visually observing the degree of bending or warping of the mica sheet when different electrolyte compositions are deposited thereon.

The oxygen-rich electrolyte layer 44 and oxygen-deficient electrolyte layer 47 were also found to have different chemical compositions. Table I shows the atomic concentrations of lithium, phosphorus and oxygen, measured using SIMS (Secondary Ion Mass Spectrometer) and RBS (Rutherford Backscattering Spectroscopy) on an oxygen-deficient electrolyte layer 47 in comparison to an oxygen-rich electrolyte layer 44. It is seen that the oxygen content in the oxygen-deficient electrolyte layers 47 at 46% is significantly lower than the oxygen content of the oxygen-rich electrolyte layer 44 at 55%. This meant that the atomic concentration of oxygen in the oxygen-rich electrolyte layer 44 is at least about 3% higher, or even 5% higher, or even 10% higher, than the atomic concentration of oxygen in the oxygen-deficient electrolyte layer 47. The density of the oxygen-rich electrolyte layer 44 was also found to be higher at $6.36 \times 10^{22}$ atom/cc as compared to $6.12 \times 10^{22}$ atom/cc for the oxygen-deficient electrolyte layer 47.

TABLE I

| | Thickness [Å] | Atomic Concentration [atom %] | | | Density [atom/cc] |
| --- | --- | --- | --- | --- | --- |
| | | Li | P | O | |
| Oxygen-deficient electrolyte layer | 3500 | 38.4 | 15.6 | 46 | 6.12E22 |
| Oxygen-rich electrolyte layer | — | 28.4 | 16.6 | 55 | 6.36E22 |

The following examples illustrate the superior properties of battery cells 22 having an oxygen-rich electrolyte layer 44 or multilayer electrolyte 49, which include lower compressive stress levels, lower delamination levels, less defects, and improved charge retention over multiple charge and discharge cycles. While these examples are provided to illustrate the invention, they should not be used to limit the scope of the present claims.

Figure 3:
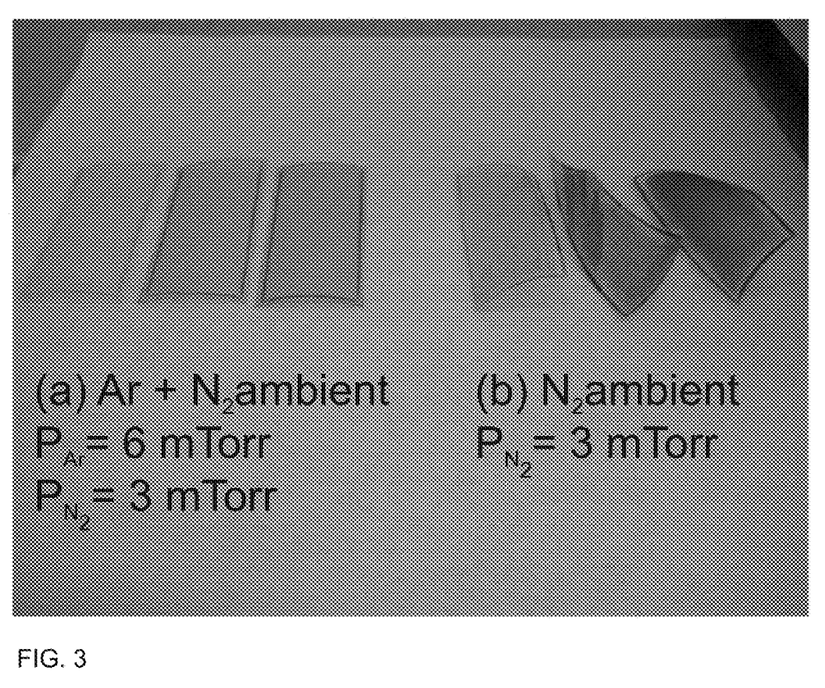
FIG. 3 is a photograph of a plurality of battery supports that have different compositions of an electrolyte of lithium-phosphorous-oxygen-nitrogen (LiPON), and showing (a) low warping and bending of the supports on which a single layer of an oxygen-rich electrolyte layer was deposited using a sputtering gas comprising nitrogen and argon, and (b) high warping and bending of the supports on which a single layer of an oxygen-deficient electrolyte layer was deposited using a sputtering gas consisting only of nitrogen.

One advantage is that the oxygen-rich electrolyte layer 44 or multilayer electrolyte 49 have lower compressive stress levels and thus result in higher battery yields because there is less delamination of these layers from the battery cells 22. A visual comparison of the internal stresses formed by an electrolyte of lithium phosphorus oxygen nitrogen on a support 24 of mica, was determined by depositing (a) a single layer of the oxygen-rich electrolyte layer 44 using a sputtering gas comprising nitrogen and argon, and (b) a single layer of the oxygen-deficient electrolyte layer 47 using a sputtering gas comprising only nitrogen, is shown in FIG. 3. The layer of oxygen-rich electrolyte layer 44 was deposited using a sputtering gas comprising nitrogen at a partial pressure of 3 mTorr and argon at a partial pressure of 6 mTorr. The layer of oxygen-deficient electrolyte layer 47 was deposited using a sputtering gas consisting only of nitrogen at a partial pressure of 3 mTorr. In these examples, the support 24 was a mica sheet having a thickness of about 50 microns, which served as a thin transparent plate that was sufficiently flexible to warp and bend from the compressive stresses applied by the two types of deposited electrolyte film. The mica supports 24 onto which the oxygen-rich electrolyte layer 44 was deposited exhibited low internal compressive stresses as visually apparent from the low warping and bending of these supports. In contrast, the mica supports 24 onto which an oxygen-deficient electrolyte layer 47 was deposited exhibited high internal compressive stresses as visually apparent from the high warping and bending of these supports. A measure of the low internal compressive stress level of the composition of the oxygen-rich electrolyte layer 44 can be determined from the maximum height of a warped portion of across a width of the mica support. For example, when the oxygen-rich electrolyte layer 44 is deposited on a mica support having a thickness of 50 microns and a width of 25 mm, the maximum height of a warped portion across the width of the mica support is less than 5 mm for the total width of 25 mm, or less than 20% of the width. In contrast, the high internal compressive stress levels of the composition of the oxygen-deficient electrolyte layer 47 can be determined from maximum height of the bent and curved width portion of the corresponding mica supports 24 which were larger than 10 mm for a total width of 25 mm or more than 40%. When correlated to the internal compressive stresses, the oxygen-deficient electrolyte layer 47 was determined to have an internal compressive stress level which was at least about 2 times higher than an internal compressive stress level of the oxygen-rich electrolyte layer 44.

Figure 4:
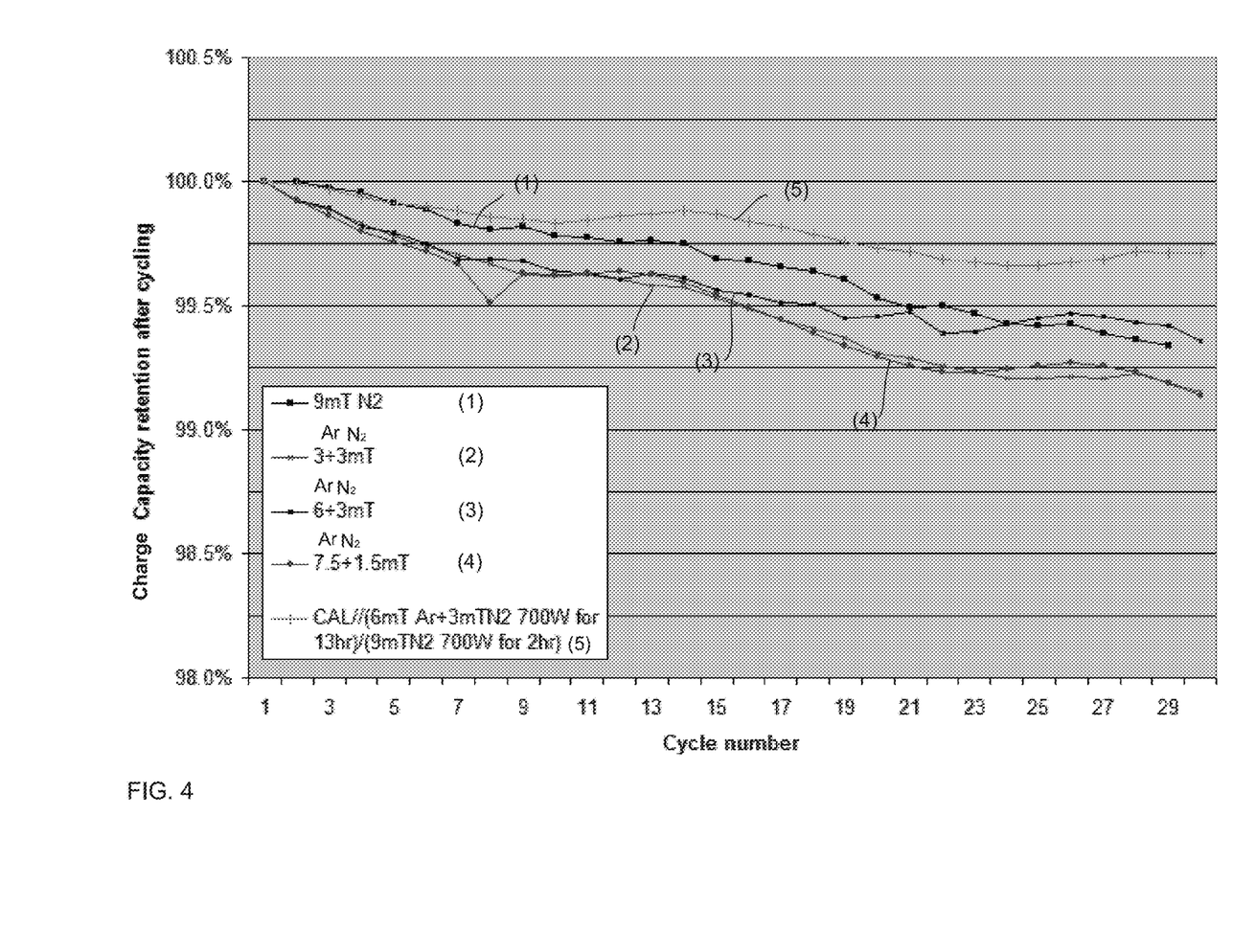

The oxygen-rich electrolyte layer 44 and multilayer electrolyte 49 were also found to provide higher charge capacities and lower charge capacity losses, after multiple charging and discharging cycles, as compared to conventional electrolyte layers. FIG. 4 shows a graph of the loss in charge over a number of charging and discharging cycles for a plurality of batteries 20 that each comprise a single battery cell 22 with an oxygen-rich electrolyte layer 44 deposited at different sputtering conditions or a multilayer electrolyte 49. In these examples, the batteries 20 were charged at a charging voltage of 4.2 V for 40 minutes, and then discharged at a discharge current of 1 mA. As seen from FIG. 4, batteries 20 comprising battery cells 22 having a multi-layer electrolyte 49 comprising an oxygen-rich electrolyte layer 44 and an oxygen-deficient electrolyte layer 47, provided the lowest loss in charge capacity (or discharge capacity) over a number of charge and discharge cycles.

Example (1) of FIG. 4 is a battery 20 comprising a single battery cell 22 which was fabricated with an oxygen-deficient electrolyte layer 47 deposited using a sputtering gas comprising only nitrogen maintained at a high partial pressure of 9 mTorr in the sputtering chamber 100. As seen, the battery of Example 1 exhibited good battery capacity retention of 99.3% (of the original battery capacity) after about 30 cycles of charging and discharging. Accordingly, this sputtering gas composition was advantageous for the deposition of an oxygen-deficient layer 47. However, an entire bulk layer could not be deposited using these sputtering conditions as the deposited bulk (larger thickness) layer was found to exhibit somewhat higher stress levels, provided lower yields, and had a higher internal resistance (Rin) compared to an oxygen-rich electrolyte layer 44 deposited using a mixture of Ar at a partial pressure of 6 mTorr and N2 at a partial pressure of 3 mTorr, as described further below.

Example (2) is a battery 20 comprising a single battery cell 22 which was fabricated with an oxygen-rich electrolyte layer 44 deposited using a mixture of nitrogen at a partial pressure of 3 mTorr, and argon at a partial pressure of 3 mTorr. As seen, the capacity retention trace of the battery of Example 2 shows a capacity retention of 99.2%.

Example (3) is a battery 20 comprising a single battery cell 22 which was fabricated with an oxygen-rich electrolyte layer 44 deposited using a mixture of nitrogen at a partial pressure of 3 mTorr and argon at a partial pressure of 6 mTorr. As seen, the capacity retention trace of the battery of Example 3 shows a charge capacity retention of 99.4%, which is very high. Accordingly, this sputtering gas composition was advantageous for the deposition of an oxygen-rich layer 44.

Example (4) is a battery 20 comprising a single battery cell 22 which was fabricated with an oxygen-rich electrolyte layer 44 deposited using a mixture of nitrogen at a partial pressure of 1.5 mTorr and argon at a partial pressure of 7.5 mTorr. As seen, the capacity retention trace of the battery of Example 4 shows a charge capacity retention of 99.2%.

Example (5) is a battery 20 comprising a single battery cell 22 which was fabricated with a multilayer electrolyte 49 comprising (i) an oxygen-rich electrolyte layer 44 deposited on the top of a cathode 42 using a sputtering gas consisting of argon at a partial pressure of 6 mTorr and nitrogen at a partial pressure of 3 mTorr, energized at a power level of 700 W for 13 hours, and (ii) an oxygen-deficient layer 47 deposited on top of the oxygen-rich electrolyte layer 44, using a sputtering gas consisting of nitrogen at a pressure of 9 mTorr and energized at a power level of 700 W for 2 hours. The capacity retention trace of the battery of Example (5) shows a high charge capacity retention of 99.7%, which was the highest retention value of the batteries. Accordingly, this multilayer stacked electrolyte was a preferred version for the battery.

The examples shown in Table II compare the physical and electrical properties obtained for single layers of an oxygen-rich electrolyte layer 44 or oxygen-deficient electrolyte layer 47, which were deposited using different sputtering process conditions and which have different thicknesses. Table II lists the sputtering process conditions, total thickness of the electrolyte layer, deposition rate, average internal electrical resistance, internal film stress, and the defect rates. The electrolyte layers were all deposited on a cathode 42 of a battery cell 22. The sputtering conditions include the (i) gas composition, (ii) partial pressure of each gas introduced into the chamber to form the sputtering gas, and (iii) sputtering or deposition time. These sputtering processes were all conducted by applying an AC (or DC) current at a power level of 700 Watts applied to the magnetron 78 of the chamber 100. Comparing examples 1 to 3 (from top down), it is seen that higher partial pressures of nitrogen (9 and 15 mTorr of only nitrogen) provides an electrolyte layer having lower internal stress levels than a lower pressure of 3 mTorr, although defect rates remained high at 95% to 100%. Example 4 (no. 4 from the top down) deposited an oxygen-rich electrolyte layer 44 using a process gas comprising argon at a partial pressure of 6 mTorr and nitrogen at a partial pressure of 3 mTorr, a power level of 700 watts applied to the magnetron 78 to generate the plasma, and a sputtering time of 12 hours. Examples 4, 5 and 7 had the lowest defect levels of 26%, 36% and 33% and also exhibited "low" stress levels. Generally, it was found that both the stress levels of the deposited layer and the defect rate of the resultant oxygen-rich electrolyte layer 44 were significantly reduced by using a sputtering gas comprising nitrogen and argon. This reduction in defect rate was believed to result from a reduction of the internal film stresses that occurred when using a mixture of nitrogen and argon, and the resultant lower partial pressure of nitrogen. Table 1 also shows resistance dependence on the deposition conditions in the column Ave. Rin (average internal resistance) of a large number of thin film batteries for each deposition condition. Comparing Example (3) which was deposited using 3 mTorr $N_2$ only, with Example (6) which was deposited using Ar at 3 mTorr and $N_2$ at 3 mTorr, and Example (4) which was deposited using Ar at 6 mTorr and $N_2$ at 3 mTorr, it is found that lower internal resistance can be obtained by adding Ar into the sputtering gas while maintaining the same partial pressure of nitrogen. The oxygen-rich electrolyte layer 44 and multilayer electrolyte 49 deposited using these process parameters also provided higher capacity retention capacity than conventional electrolyte layers.

TABLE II

| Electrolyte deposition ambient | Thickness (um) | Rate (um/hr) | Ave. Rin (ohm) | Stress | Defect rate |
|---|---|---|---|---|---|
| cathode//15 mTorr N2 | 2.84 | 0.18 | 122 | Medium | 100% |
| cathode//9 mTorr N2 for 12 hr | 2.86 | 0.24 | 94 | Medium | 95% |
| cathode//3 mTorr N2 for 11 hr | 3.10 | 0.28 | 83 | High | 100% |
| cathode//Ar + N2 = 6 + 3 mTorr for 12 hr | 2.77 | 0.23 | 73 | Low | 26% |
| cathode//Ar + N2 = 7.5 + 1.5 mTorr for 14.5 hr | 3.25 | 0.22 | 92 | Low | 36% |
| cathode//Ar + N2 = 3 + 3 mTorr for 14 hr | 4.10 | 0.29 | 76 | Medium | 63% |
| cathode//Ar + N2 = 7.82 + 1.18 mTorr for 15 hr | 3.58 | 0.24 | 96 | Low | 33% |
| cathode//(6 mT Ar + 3 mTN2 for 13 hr)/(9 mTN2 for 2 hr) | 3.59 | 0.24 | 88 | Medium | 40% |
| cathode//(9 mTN2 for 2 hr)/(6 mT Ar + 3 mTN2 for 13 hr) | 3.48 | 0.23 | 103 | Medium | 63% |

TABLE II-continued

| Electrolyte deposition ambient | Thickness (um) | Rate (um/hr) | Ave. Rin (ohm) | Stress | Defect rate |
|---|---|---|---|---|---|
| cathode//(9 mTN2 for 2 hr)/(6 mT Ar + 3 mTN2 for 13 hr)/(9 mTN2 for 2 hr) | 3.16 | 0.21 | 107 | Medium | 53% |
| cathode//(Ar + N2 = 7.5 + 1.5 mTorr for 2 hr)/(6 mT Ar + 3 mTN2 for 13 hr)/(Ar + N2 = 7.5 + 1.5 mTorr for 2 hr) | 3.75 | 0.25 | 106 | Medium | 20% |

Thus the oxygen-rich electrolyte layer 44 and multilayer electrolyte 49 provide significant and unexpected benefits over conventional electrolyte layers including higher charge capacity retention over multiple charge and discharge cycles, lower delamination, less defects, and lower stress levels.

A sputtering apparatus 90 comprising a sputtering chamber 100 capable of depositing the battery component layers 30 of each of the battery cells 22, including the adhesion layer 34, cathode current collector 38, cathode 42, oxygen-rich electrolyte layer 44 and multilayer electrolyte 49, anode 48, and anode current collector 50, onto a battery support 24, is illustrated in FIG. 5. The sputtering chamber 100 comprises a sidewall 108, upper wall 110 which may be a ceiling, and lower wall 112, all of which surround and enclose a sputtering zone 114. The chamber sidewall 108 can be electrically isolated from the upper wall 110 and the lower wall 112 and can be electrically grounded. Sputtering gas is introduced into the chamber via a gas distributor 126 having gas holes 139 which is connected to a sputtering gas supply 123 which can include compressed gas cylinders, flow meters, valves, and other flow control equipment. The sputtering gas as described herein are energized to form a plasma that ionizes and sputters material from the sputtering targets 62, and/or can also contain reactive gases that react with sputtered material from a sputtering target 62 to form compounds that deposit on the support 24. The chamber 100 can be evacuated to a preset pressure and the process or sputtering gas provided in the chamber maintained at a predefined pressure, by a gas exhaust 130 comprising one or more vacuum pumps 131 and a throttle valve 132.

A sputtering target 62 comprising a backing support 70 supporting a sputtering member 64 is fastened in the sputtering chamber 100 to oppose and face a support carrier 104. The sputtering target 62 is positioned abutting a magnetron 78, which generates a magnetic field about the surface of the sputtering target 62 to provide a more uniform and continuous bombardment of the target 62 with sputtering plasma ions during the sputtering process. The magnetron 78 contains one or more magnets 92, and can be internally mounted inside the chamber 100 or externally mounted. A target power source 118 comprising one or more power supplies provides an AC voltage at a voltage level of from about 200V and about 1200V, or even from about 250V to about 450V. The voltage can be provided at a power level of from about 1 kW and about 20 kW, or even from about 3 KW to about 10 KW. The voltage can also be provided at a mid-frequency level of from about 10 to about 100 kHz, or even at a frequency of from about 20 kHz to about 80 kHz.

The sputtering member 64 is composed of one or more of the elements or materials to be sputtered onto the support 24, and can be rectangular, circular or cylindrical in shape, depending on the shape or configuration of the chamber 100 or battery support 24. For example, the sputtering member 64 can be composed of a lithium compound, such as lithium, lithium oxide, lithium cobalt oxide, or other lithium compounds. The lithium-containing material is selected to obtain the desired composition of a lithium-containing layer 31. For example, a cathode 42 of a battery cell 22 can deposited using a sputtering member 64 composed of lithium cobalt oxide having the stochiometric formula $LiCoO_2$. As another example, an oxygen-rich electrolyte layer 44 or oxygen-deficient electrolyte layer 47 of a battery cell 22 can deposited using a sputtering member 64 composed of lithium, lithium oxide or lithium phosphate. As still another example, an anode 48 of a battery cell 22 can be deposited using a sputtering member 64 composed of lithium.

A support carrier 104 is transported into the sputtering chamber 100 and positioned facing the sputtering target 62 inside the chamber 100. The support carrier 104 is capable of holding one or more supports 24 so that at least about one surface 26 of a single or plurality of supports 24, or both surfaces 26, 27 of one or more supports 24 (not shown), are exposed to the sputtering zone 114. For example, the support carrier 104 can be a rotating carousel or mechanical conveyor. The support carrier 104 is typically fabricated from plates of a metal such as copper or stainless steel.

In a sputtering process, the sputtering chamber 100 is controlled by a controller 119 that comprises program code to operate and control the various components of the chamber 100 to deposit the battery component layers 30 on a plurality of battery supports 24 in the chamber 100. The controller 119 comprises, for example, a general purpose computer or control electronic box, which has program code to control the gas supply 123, gas distributor 126, pump 131, throttle valve 132, target power source 118 to apply a power to the sputtering target 62 or magnetron 78, and other chamber components. For example, the chamber 100 can be evacuated to a preset pressure by the gas exhaust 130 to a pressure of less than about $10 \times 10^{-5}$ Torr, prior to introduction of any cleaning or sputtering gas. Thereafter, controlled amounts of cleaning or sputtering gas are introduced into the chamber 100 via the gas distributor 126. For example, a cleaning plasma of an inert gas such as argon can be used to clean residues from the sputtering target 62 and inner surfaces of the chamber 100, or a sputtering gas of the desired composition can be used to deposit the battery component layers 30 of the battery cell 22.

While illustrative embodiments of the battery 20 are described in the present application, it should be understood that other embodiments are also possible. The exemplary anode and battery cell structures described herein are provided only to illustrate the present invention, and other structures can be used as would be apparent to those of ordinary skill in the art. Furthermore, the battery components layers 30 and fabrication processes are also exemplary and may comprise other materials. Also, each battery 20 may contain a plurality of battery cells 22 connected in series or parallel and arranged depending on the application. Thus the scope of the claims should not be limited by the exemplary methods of manufacture, materials and structures provided herein.

What is claimed is:

1. A solid-state lithium battery cell comprising:
    (a) a support;
    (b) a plurality of electrodes on the support; and
    (c) a multilayer electrolyte between a pair of the electrodes, the multilayer electrolyte (i) composed of lithium-phosphorous-oxygen-nitrogen, and (ii) comprising an oxygen-rich electrolyte layer abutting at least one oxygen-deficient electrolyte layer, the oxygen-rich electrolyte layer having an atomic concentration of oxygen of at least about 55%, where 100% is the total of the atomic concentrations of lithium, phosphorous and oxygen, and the oxygen-rich electrolyte layer comprising an atomic concentration of oxygen that is higher than the atomic concentration of oxygen in the oxygen-deficient electrolyte layer.

2. A battery according to claim 1 wherein the oxygen-rich electrolyte layer comprises a bulk density of at least about $6.3 \times 10^{22}$ atom/cc.

3. A battery according to claim 1 wherein the oxygen-rich electrolyte layer is on a mica support having a width, and wherein the maximum height of a warped portion across the width of the mica support is less than 20% of the width.

4. A battery according to claim 1 wherein the oxygen-rich electrolyte layer is on a mica support, and wherein the maximum height of a warped portion across the width of the mica support is less than 5 mm.

5. A solid-state lithium battery cell comprising:
(a) a support;
(b) a plurality of electrodes on the support; and
(c) a multilayer electrolyte between a pair of the electrodes, the multilayer electrolyte (i) composed of lithium-phosphorous-oxygen-nitrogen, and (ii) comprising an oxygen-rich electrolyte layer sandwiched between oxygen-deficient electrolyte layers, the oxygen-rich electrolyte layer having an atomic concentration of oxygen of at least about 55%, where 100% is the combined atomic concentrations of lithium, phosphorous and oxygen, and the oxygen-rich electrolyte layer having an atomic concentration of oxygen that is higher than the atomic concentration of oxygen of the oxygen-deficient electrolyte layers.

6. A battery according to claim 5 wherein the atomic concentration of oxygen in the oxygen-rich electrolyte layer is at least about 3% higher than the atomic concentration of oxygen in the oxygen-deficient electrolyte layers.

7. A battery according to claim 5 wherein the oxygen-deficient electrolyte layers have an atomic concentration of oxygen that is less than about 48%.

8. A battery according to claim 5 wherein the oxygen-rich electrolyte layer comprises a bulk density of at least about $6.3 \times 10^{22}$ atom/cc.

9. A battery according to claim 5 wherein the oxygen-deficient electrolyte layers have a bulk density of less than about $6.2 \times 10^{22}$ atom/cc.

10. A battery according to claim 5 wherein the oxygen-rich electrolyte layer comprises a first thickness and the oxygen-deficient electrolyte layers have a second thickness, and wherein the first thickness is at least about 5 times the second thickness.

11. A battery according to claim 5 wherein the oxygen-deficient electrolyte layers have an internal compressive stress level that is at least about 2 times the internal compressive stress level of the oxygen-rich electrolyte layer.

12. A solid-state lithium battery cell comprising:
(a) a support;
(b) a plurality of electrodes on the support; and
(c) a multilayer electrolyte between a pair of the electrodes, the multilayer electrolyte (i) composed of lithium-phosphorous-oxygen-nitrogen, and (ii) comprising an oxygen-rich electrolyte layer sandwiched between oxygen-deficient electrolyte layers, the oxygen-rich electrolyte layer having an atomic concentration of oxygen that is at least about 3% higher than the atomic concentration of oxygen in the oxygen-deficient electrolyte layers, and the oxygen-deficient electrolyte layers comprising an atomic concentration of oxygen that is less than about 48%, where 100% is the combined atomic concentrations of lithium, phosphorous and oxygen.

13. A battery according to claim 12 wherein the oxygen-rich electrolyte layer comprises an atomic concentration of oxygen that is at least about 55%.

14. A battery according to claim 12 wherein the oxygen-rich electrolyte layer comprises a bulk density of at least about $6.3 \times 10^{22}$ atom/cc, and the oxygen-deficient electrolyte layers have a bulk density of less than about $6.2 \times 10^{22}$ atom/cc.

15. A battery according to claim 12 wherein the oxygen-rich electrolyte layer comprises a first thickness and the oxygen-deficient electrolyte layers each have a second thickness, and wherein the first thickness is at least about 5 times the second thickness.

16. A battery according to claim 12 wherein the oxygen-deficient electrolyte layers have an internal compressive stress level that is at least about 2 times the internal compressive stress level of the oxygen-rich electrolyte layer.

17. A battery according to claim 1 wherein the oxygen-rich electrolyte layer comprises an atomic concentration of oxygen that is at least about 3% higher than the atomic concentration of oxygen in the oxygen-deficient electrolyte layer.

18. A battery according to claim 17 wherein the oxygen-rich electrolyte layer comprises an atomic concentration of oxygen that is at least about 10% higher than the atomic concentration of oxygen in the oxygen-deficient electrolyte layer.

19. A battery according to claim 17 wherein the oxygen-rich electrolyte layer has a first thickness and the oxygen-deficient electrolyte layer has a second thickness, such that the first thickness is at least about 5 times the second thickness.

20. A battery according to claim 1 wherein the oxygen-rich electrolyte layer is sandwiched between two oxygen-deficient electrolyte layers.

* * * * *